United States Patent
De Laurentiis et al.

(10) Patent No.: US 7,417,460 B2
(45) Date of Patent: Aug. 26, 2008

(54) MULTI-STANDARD TRANSMITTER

(75) Inventors: Pierpaolo De Laurentiis, Milan (IT); Hua Wang, Shenzhen (CN)

(73) Assignee: STMicroelectronics S.r.l., Agrate Brianza (IT)

( * ) Notice: Subject to any disclaimer, the term of this patent is extended or adjusted under 35 U.S.C. 154(b) by 51 days.

(21) Appl. No.: 11/481,560

(22) Filed: Jul. 5, 2006

(65) Prior Publication Data

US 2007/0024320 A1 Feb. 1, 2007

(30) Foreign Application Priority Data

Jul. 6, 2005 (IT) .......................... MI2005A1276

(51) Int. Cl.
*H03K 19/094* (2006.01)
(52) U.S. Cl. .............................. 326/82; 326/83; 326/87
(58) Field of Classification Search .................. 326/82, 326/83, 115
See application file for complete search history.

(56) References Cited

U.S. PATENT DOCUMENTS

| | | | | |
|---|---|---|---|---|
| 4,350,937 A | * | 9/1982 | Miyazaki et al. ............ | 388/816 |
| 5,939,904 A | * | 8/1999 | Fetterman et al. ............. | 327/67 |
| 6,107,882 A | * | 8/2000 | Gabara et al. ................ | 330/253 |
| 6,356,141 B1 | * | 3/2002 | Yamauchi .................... | 327/543 |
| 6,731,135 B2 | * | 5/2004 | Brunolli ....................... | 326/83 |
| 7,078,943 B2 | * | 7/2006 | Ho et al. ...................... | 327/108 |
| 7,227,382 B1 | * | 6/2007 | Talbot et al. .................. | 326/87 |
| 2003/0193350 A1 | * | 10/2003 | Chow ........................... | 326/83 |
| 2005/0285629 A1 | * | 12/2005 | Hein et al. .................... | 326/115 |
| 2007/0182503 A1 | * | 8/2007 | Petrofsky .................... | 331/185 |

* cited by examiner

*Primary Examiner*—Rexford Barnie
*Assistant Examiner*—Thienvu V Tran
(74) *Attorney, Agent, or Firm*—Lisa K. Jorgenson; Robert Iannucci; Seed IP Law Group PLLC (57) ABSTRACT

A multi-standard transmitter includes a differential stage that includes a current generator transistor; first and second transistors connected between a first node and the generator transistor and having respective control terminals connected to a first input terminal, the first and second transistors being interconnected at a first output terminal; third and fourth transistors connected between the first node and the generator transistor and having respective control terminals connected to a second input terminal, the third and fourth transistors being interconnected at a second output terminal; and first and second resistances connected between the first and second output terminals and interconnected at a second node. The transmitter includes a selective enabling circuit connected to the first and second nodes, and to a third node corresponding to a control terminal of the generator transistor. The selective enabling circuit supplies the nodes with regulation signals that modify an operating mode of the transmitter.

27 Claims, 8 Drawing Sheets

MULTI-STANDARD TRANSMITTER

BACKGROUND OF THE INVENTION

1. Field of the Invention

The present invention refers to a multi-standard transmitter.

The invention concerns in particular, but not exclusively, a multi-standard transmitter for telecommunication systems and the following description refers to this field of application with the sole purpose of making it easier to explain.

2. Description of the Related Art

As well known, the configuration of interfacing devices or interfaces is one of the most critical parameters that influence the transfer of data with high performance.

The ability to interchange between different types of interface is indeed to this day a challenge that often influences the schedules linked to the configuration of devices using such interfaces and to their actual distribution onto the markets.

In particular, in making high-speed telecommunication systems, differential interfaces have become popular, like interfaces LVDS (acronym for: "Low-Voltage Differential Signalling"), LVPECL (acronym for: "Low-Voltage Positive Emitter-Coupled Logic") and CML (acronym for: "Current-Mode Logic"). The success of such differential interfaces is linked to their ability to tolerate common-mode noise.

In any case, the transition between different types of interface used in transmitters and receivers of such telecommunication systems is problematic, should the technological differences between them not be taken into due consideration.

To better understand such technological differences, hereafter the basic characteristics of transmitters using known differential interfaces shall be described in greater detail.

A transmitter with LVDS interface or LVDS transmitter, as defined by standard IEEE1596.3, is a device made with low-voltage differential technology and with low power level, primarily intended for point-to-point data communication. Compared to other standard differential devices with cabled control, the LVDS transmitter has a minimum differential voltage oscillating in an admissible range of 250-400 mV with an offset value of 1.2Volt above a ground value.

Figure 1:
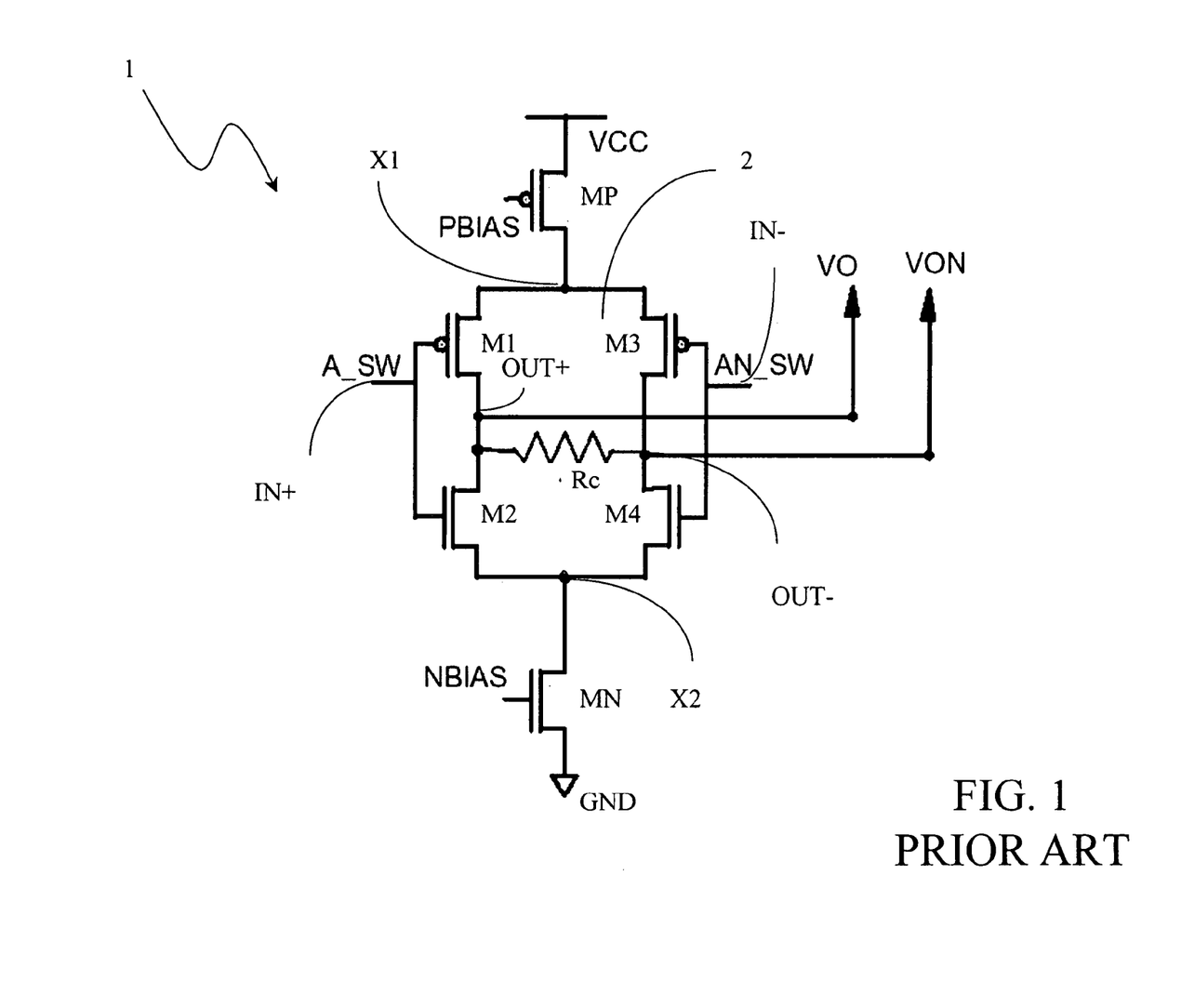
FIG. 1 schematically shows an LVDS transmitter made according to the prior art.

Such an LVDS transmitter is schematically shown in FIG. 1, wholly indicated with 1.

The LVDS transmitter 1 essentially comprises a differential stage 2 with MOS transistors connected to a first and to a second voltage reference, in particular a VCC supply voltage reference and a ground GND, at a first X1 and a second inner circuit node X2 through a first MP and a second transistor MN, respectively, in particular a P channel MOS transistor and an N channel MOS transistor having the function of current generators.

The differential stage 2 has a pair of input terminals, IN+ and IN−, receiving respective complementary input signals, A_SW and AN_SW, as well as a pair of output terminals, OUT+ and OUT−, suitable for providing respective complementary output signals, VO and VON.

In greater detail, the differential stage 2 comprises a first M1 and a second transistor M2 inserted, in series with each other, between the first X1 and the second inner circuit node X2 and having respective control terminals connected together and to the first input terminal IN+ of the differential stage 2. Such first M1 and second transistors M2 are interconnected at the first output terminal OUT+ of the differential stage 2.

Similarly, the differential stage 2 comprises a third M3 and a fourth transistor M4 inserted, in series with each other, between the first X1 and the second inner circuit node X2 and having respective control terminals connected together and to the second input terminal IN− of the differential stage 2. Such third M3 and fourth transistors M4 are interconnected at the second output terminal OUT− of the differential stage 2.

Finally, the differential stage 2 comprises a resistive end element Rc, inserted between the first OUT+ and the second output terminal OUT−.

The transistors MP and MN having the function of current generators finally have control terminals receiving respective bias voltages PBIAS and NBIAS.

Substantially, the LVDS transmitter 1 makes a balanced current source, the output terminals of which, OUT+ and OUT−, provide voltage signals VO and VON, respectively positive and negative and phase-shifted of 180°.

In a telecommunications system, a receiver connected to such output terminals OUT+, OUT− detects a differential voltage capable of providing a logic signal. The resistive end element Rc allows the output terminals OUT+ and OUT− of the LVDS transmitter 1 to adapt to the different impedance values of a transmission line of the telecommunications system in which the transmitter is inserted, optimizing the integrity of a signal thus transmitted.

It should be remembered that an LVDS transmitter 1 as described above is able to interface with receiver circuits made in other differential technologies, provided that the signal levels used by such receiver circuits are within the preset common mode range, in other words between 0 and 2.4V.

An LVPECL transmitter essentially comprises a logic stage with coupled positive emitter having low power supply, typically below 3.3V, as defined for example by the standard Jedec8-2. In particular, the LVPECL transmitter has a variable output signal within a range equal to 600-900 mV.

Figure 2:
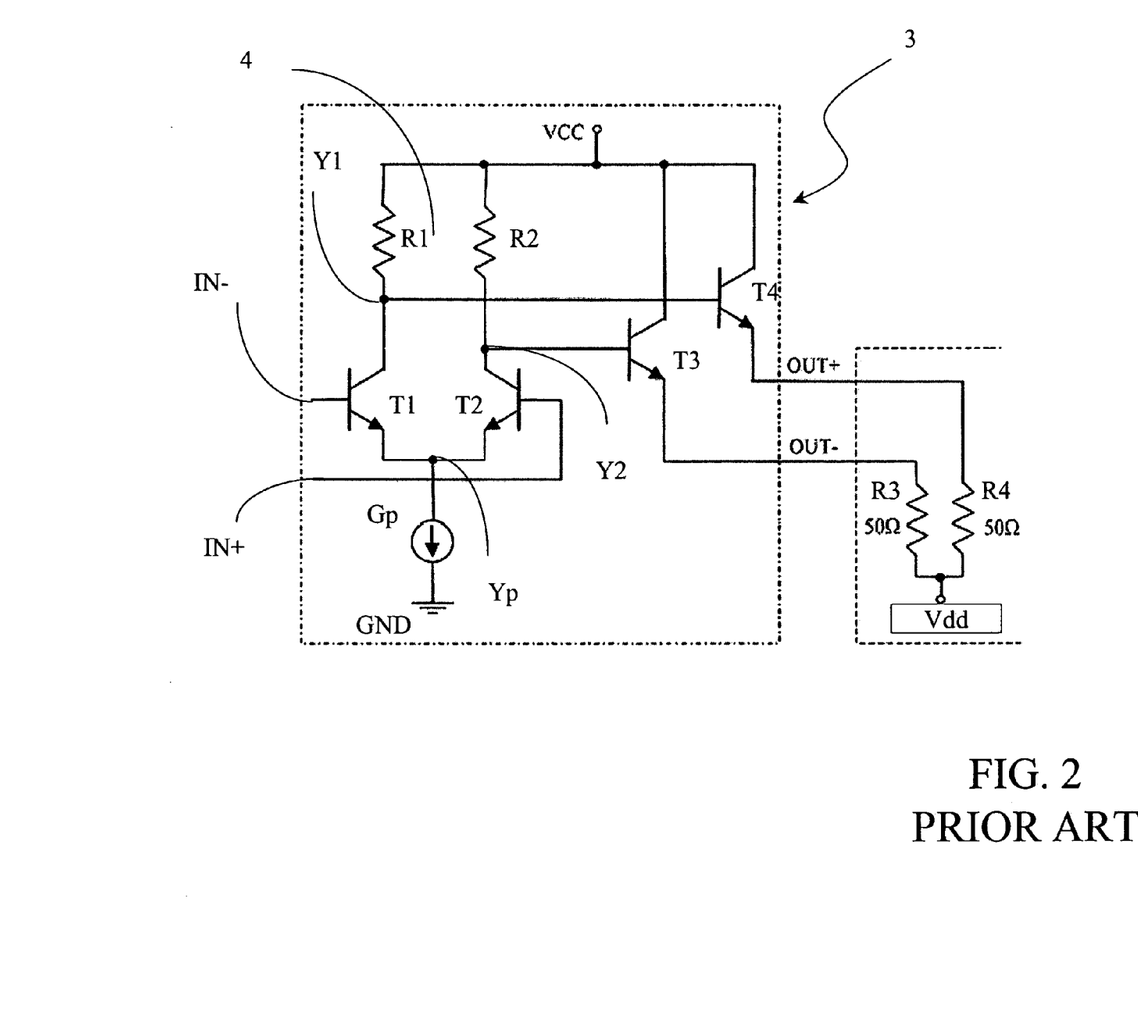
FIG. 2 schematically shows an LVPECL transmitter made according to the prior art.

Such an LVPECL transmitter is schematically shown in FIG. 2, wholly indicated with 3.

The LVPECL transmitter 3 comprises an input stage 4 inserted between a first and a second voltage reference, in particular a supply voltage reference Vcc and a ground GND, and connected to a first IN− and to a second input terminal IN+ of the LVPECL transmitter 3.

In particular, the input stage 4 comprises a first T1 and a second transistor T2, of the bipolar type having respective emitter terminals connected together, at an inner circuit node Yp, and to the ground GND through a generator Gp, respective emitter terminals connected, at a first Y1 and a second intermediate circuit node Y2, to respective first R1 and second resistive elements R2, in turn connected to the supply voltage reference Vcc, as well as command or base terminals respectively connected to the first IN− and to the second input terminal IN+ of the LVPECL transmitter 3.

The LVPECL transmitter 3 also comprises a third transistor T3 inserted between the supply voltage reference Vcc and a first output terminal OUT− of the LVPECL transmitter 3 and having a control or base terminal connected to the first intermediate circuit node Y1. Similarly, the LVPECL transmitter 3 also comprises a fourth transistor T4 inserted between the supply voltage reference Vcc and a second output terminal OUT+ of the LVPECL transmitter 3 and having a control or base terminal connected to the second intermediate circuit node Y2.

Finally, the output terminals OUT− and OUT+ of the LVPECL transmitter 3 are connected to a further supply voltage reference Vdd, respectively through a third R3 and a fourth resistive element R4, such resistive elements constituting an appropriate end for the LVPECL transmitter 3 in normal operating conditions (DC connection).

It should be noted that the structure shown for the LVPECL transmitter 3 has a low output impedance, and therefore does not carry out a correct impedance adaptation when a long transmission line is driven.

Figure 3:
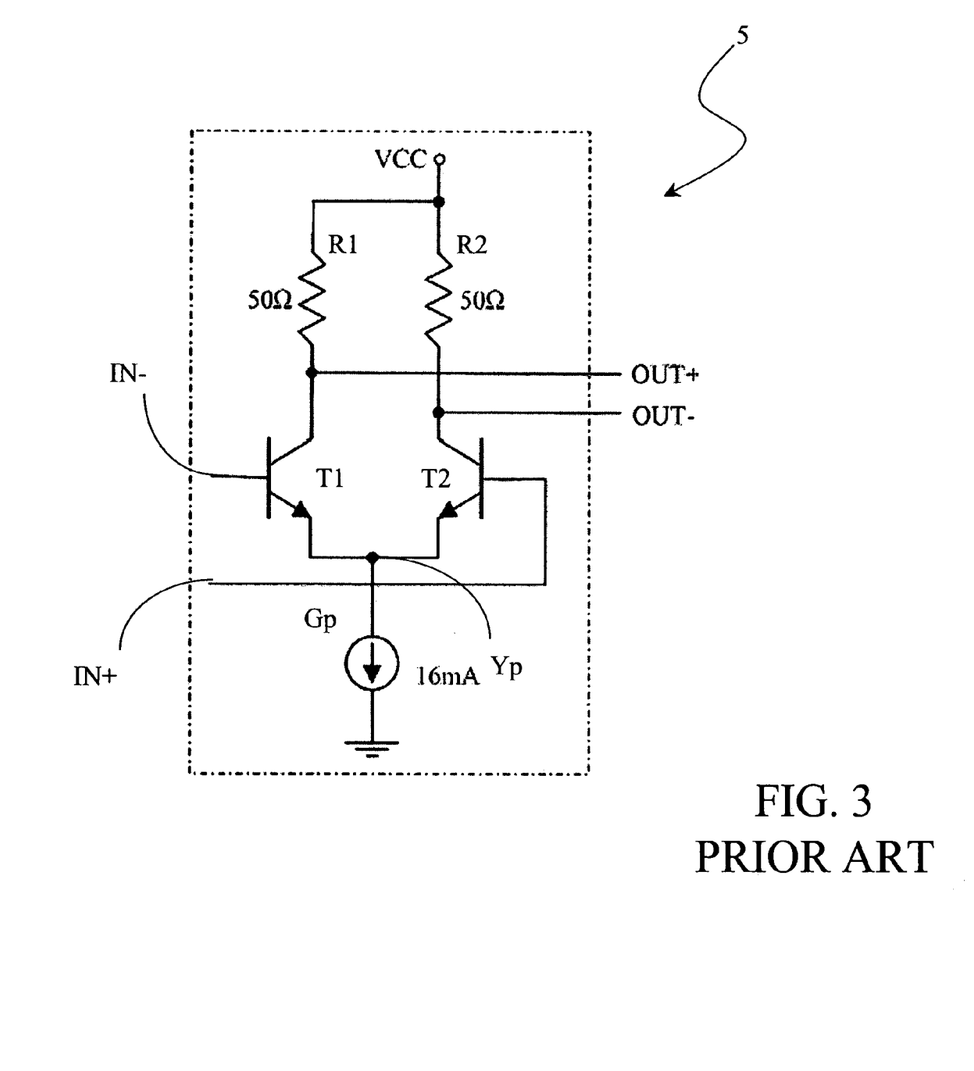
FIG. 3 schematically shows a CML transmitter made according to the prior art.

A CML transmitter essentially comprising a current switching output buffer is schematically shown in FIG. 3 and wholly indicated with 5.

The CML transmitter 5 comprises a first T1 and a second transistor T2, having respective emitter terminals connected together, at an inner circuit node Yp, and to a voltage reference, in particular a ground GND, through a generator Gp, respective emitter terminals connected to respective first R1 and second resistive element R2, in turn connected to a further voltage reference, in particular the supply voltage reference Vcc, as well as command or base terminals respectively connected to a first IN− and to a second input terminal IN+ of the CML transmitter 5.

The emitter terminal of the second transistor T2 is connected to a first output terminal OUT− of the CML transmitter 5, whereas the emitter terminal of the first transistor T1 is connected to the second output terminal OUT+ of the CML transmitter 5.

Typically, the CML transmitter 5 uses resistive elements of a value equal to 50 Ω for an optimal integrity of a transmitted signal.

Indeed, in a telecommunications system, on the receiver side, there is typically an end element with a resistive value equal to 50 Ω that make a current switch equal to 400 mV on the driver side.

It should be noted that the common mode voltage of the CML transmitter can be taken to the supply voltage value Vcc or to the value of the ground GND, but normally it is taken to a value slightly lower than the supply voltage (typically Vcc−0.2V).

Transmitters are also known that respect the standard CPRI, biased at a nominal current that is double CML, having common mode voltage values corresponding to the supply voltage value Vcc decreased by 0.4V.

In telecommunication systems, it is known to use substantially two interface modes between LVDS, LVPECL and CML type transmitters, and in particular the methods of:
 1. DC coupling;
 2. AC coupling
respectively schematically shown in FIGS. 4A and 4B.

Figure 4A:
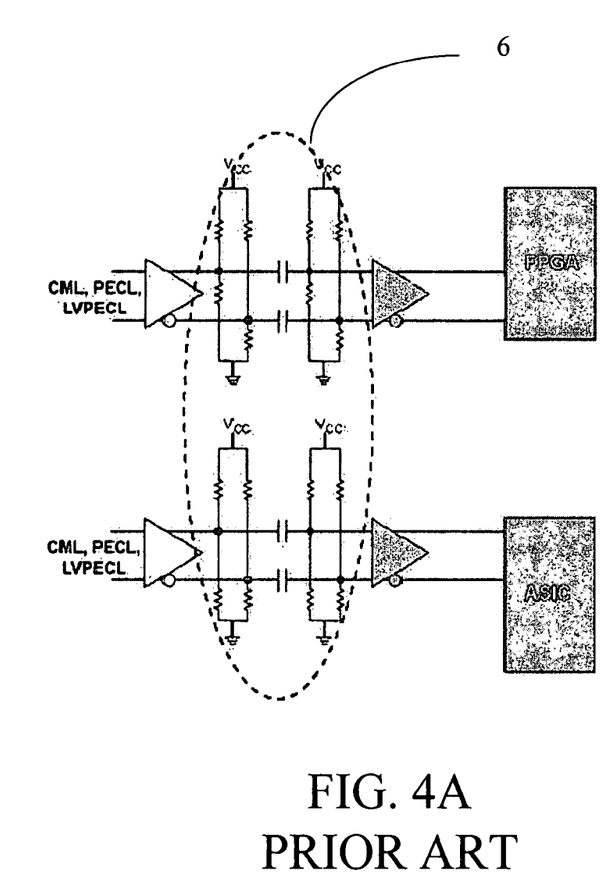
FIGS. 4A and 4B schematically show telecommunication systems comprising transmitters and receivers made according to the prior art.

The DC coupling method uses substantially a DC translation resistive network 6, as shown in FIG. 4A. According to the relationship between the interfaces included in the receiver and in the transmitter within the common mode range, the common mode voltage of such interfaces in contact through the resistive network 6 can be stepped up or stepped down.

In particular it is known to use a Therein resistive network analysis method to make an interconnection with DC coupling. For example, to place a LVPECL type transmitter in communication with an LVDS receiver, which requires a lower common mode voltage than the LVPECL transmitter, a step-down resistive network is used to reduce the common mode voltage, typically from Vcc−1.3V to 1.2V.

It can immediately be seen that the introduction of the resistive network 6 results in additional occupation of area and an increase in consumption of the telecommunication system overall. Moreover, such a solution with DC coupling does not have any configurability, it increases the attenuation of the signals, increases the costs of the printed board in which receiver and transmitter are made, lowers the yield of the telecommunication system and makes routing difficult on the printed board.

Figure 4B:
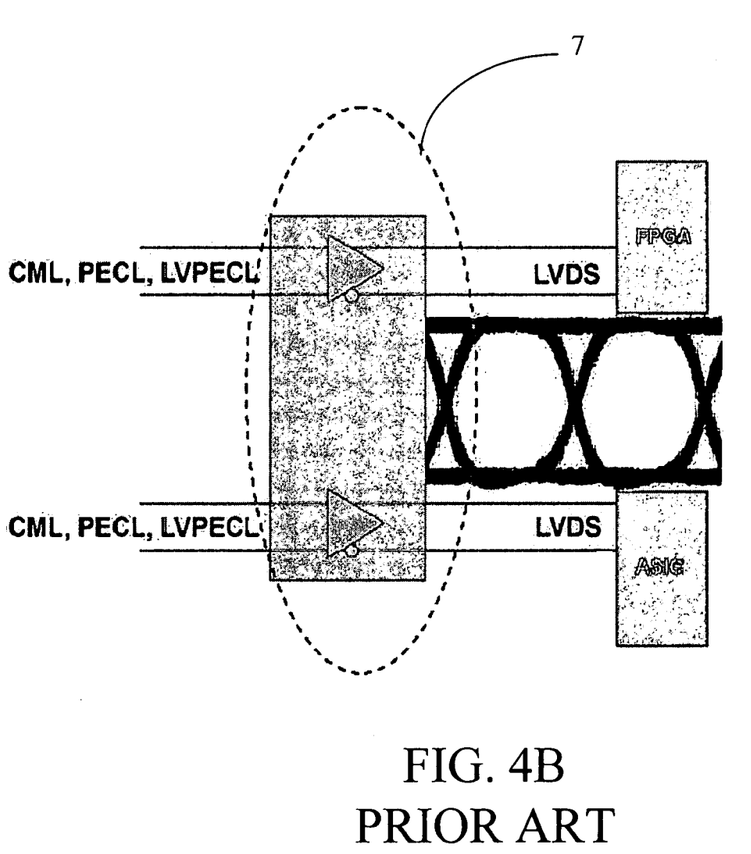

The AC coupling method, on the other hand, foresees the use of integrated buffer/translator circuits 7, as shown in FIG. 4B.

Such an integrated solution is also not without drawbacks, in particular low configurability, increased consumption, high cost of the printed board in which receiver and transmitter are made, lowering of the yield of the telecommunication system and difficult routing on the printed board.

BRIEF SUMMARY OF THE INVENTION

One embodiment of the present invention provides a multi-standard transmitter, having structural and functional characteristics such as to overcome the limitations that still besets transmitters made according to the prior art.

One embodiment of the present invention equips a transmitter with a selective enabling circuit to obtain common mode voltage and differential mode values that are compatible with different interface standards.

One embodiment of the invention refers to a multi-standard transmitter that includes a differential stage connected to a first voltage reference and to a second voltage reference. The differential stage includes:
  a first input terminal and a second input terminal;
  a first output terminal and a second output terminal;
  a current generator transistor;
  a first transistor and a second transistor connected between a first inner circuit node and the current generator transistor and having respective control terminals connected together and to the first input terminal, the first and second transistors being interconnected at said first output terminal;
  a third transistor and a fourth transistor connected between the first inner circuit node and the current generator transistor and having respective control terminals connected together and to the second input terminal, the third and fourth transistors being interconnected at the second output terminal; and
  a first resistive end element and a second resistive end element connected between the first and second output terminals and interconnected at a second inner circuit node.

The transmitter also includes a selective enabling circuit connected to the first and second inner circuit nodes, as well as to a third inner circuit node corresponding to a control terminal of the current generator transistor. The selective enabling circuit supplies the inner circuit nodes with regulation signals to modify an operating mode of the multi-standard transmitter.

The characteristics and advantages of the transmitter according to the invention shall become clear from the following description of an example embodiment thereof given for indicating and not limiting purposes with reference to the attached drawings.

DETAILED DESCRIPTION OF THE INVENTION

Figure 5A:
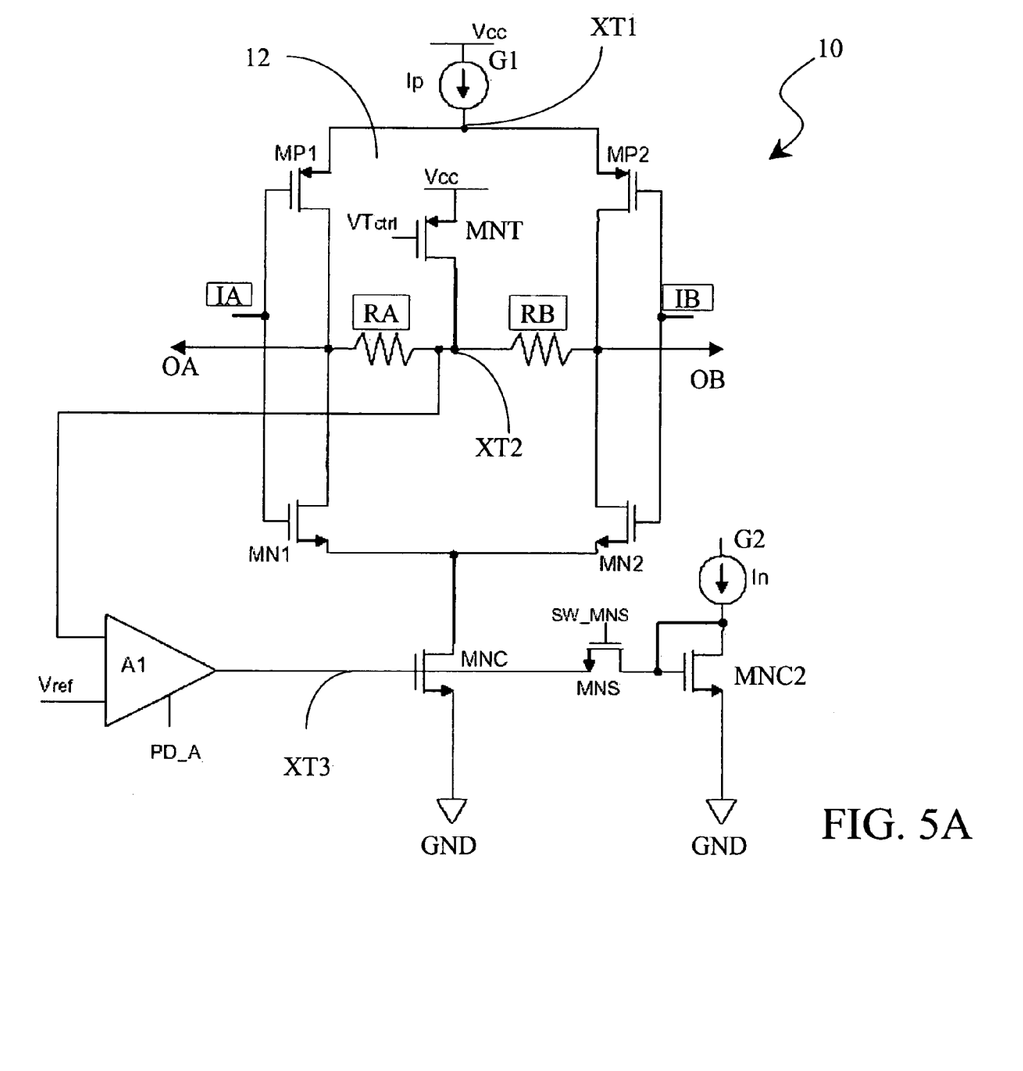
FIGS. 5A and 5B schematically show a multi-standard transmitter made according to the present invention.

With reference to such figures, and in particular to FIG. 5A, a multi-standard transmitter made according to one embodiment of the present invention is wholly and schematically indicated with 10.

The multi-standard transmitter 10 essentially comprises a differential stage 12 with MOS transistors connected to a first and to a second voltage reference, in particular a supply voltage reference VCC and a ground GND, respectively through a first generator G1 of a first regulation current Ip and a first transistor MNC having the function of a current generator, in particular an N channel MOS transistor. In particular, the first generator G1 is inserted between the supply voltage reference VCC and a first inner circuit node XT1 of the multi-standard transmitter 10.

The differential stage 12 has a pair of input terminals, IA and IB, receiving respective first VIA and second input signal VIB, as well as a pair of output terminals, OA and OB, suitable for supplying respective first VOA and second output signal VOB.

In greater detail, the differential stage 12 comprises a first MP1 and a second transistor MN1 inserted, in series with each other, between the first inner circuit node XTI and the transistor MNC having the function of a current generator and having respective control terminals connected together and to the first input terminal IA of the differential stage 12. Such first MP1 and second transistors MN1 are interconnected at the first output terminal OA of the differential stage 12.

Similarly, the differential stage 12 comprises a third MP2 and a fourth transistor MN2 inserted, in series with each other, between the first inner circuit node XT1 and the transistor MNC having the function of a current generator and having respective control terminals connected together and to the second input terminal IB of the differential stage 12. Such third MP2 and fourth transistors MN2 are interconnected at the second output terminal OB of the differential stage 12.

Advantageously, the differential stage 12 also comprises a first RA and a second resistive end element RB, inserted, in series with each other, between the first OA and the second output terminal OB and interconnected at a second inner circuit node XT2, in turn connected to the supply voltage reference Vcc through a first enabling transistor MNT having a command terminal receiving a first enabling signal VTctrl.

Suitably, the resistive end elements, RA and RB, are selected to be equal to 50 Ω. It is also possible to use trimmable resistors RA' and RB' (See FIG. 5C) to ensure optimal impedance adaptation even in the presence of a certain variability of resistive elements made in an integrated manner on silicon.

The multi-standard transmitter 10 also comprises a differential amplifier A1 having a first input terminal connected to the second inner circuit node XT2 and a second input terminal receiving a reference voltage Vref, as well as a control terminal receiving a second enabling signal PD_A.

Advantageously, the differential amplifier A1 also has an output terminal connected to a control terminal of the transistor MNC having the function of a current generator, at a third inner circuit node XT3 as well as to a first conducting terminal of a second enabling transistor MNS, in turn having a second conducting terminal connected to a control terminal of a diode-connected transistor MNC2 and a control terminal receiving a third enabling signal SW_MNS.

The diode-connected transistor MNC2 is inserted between a second generator G2 of a second regulation current In and the ground GND.

Advantageously, the enabling signals VTctrl, PD_A and SW_MNS are logic signals that can take just two values. In particular, the first enabling signal VTctrl is a voltage signal that can take the value Vcc corresponding to the supply voltage reference and GND corresponding to the ground, whereas the second PD_A and the third enabling signals SW_MNS are voltage signals that can take respective high and low values.

Figure 5B:
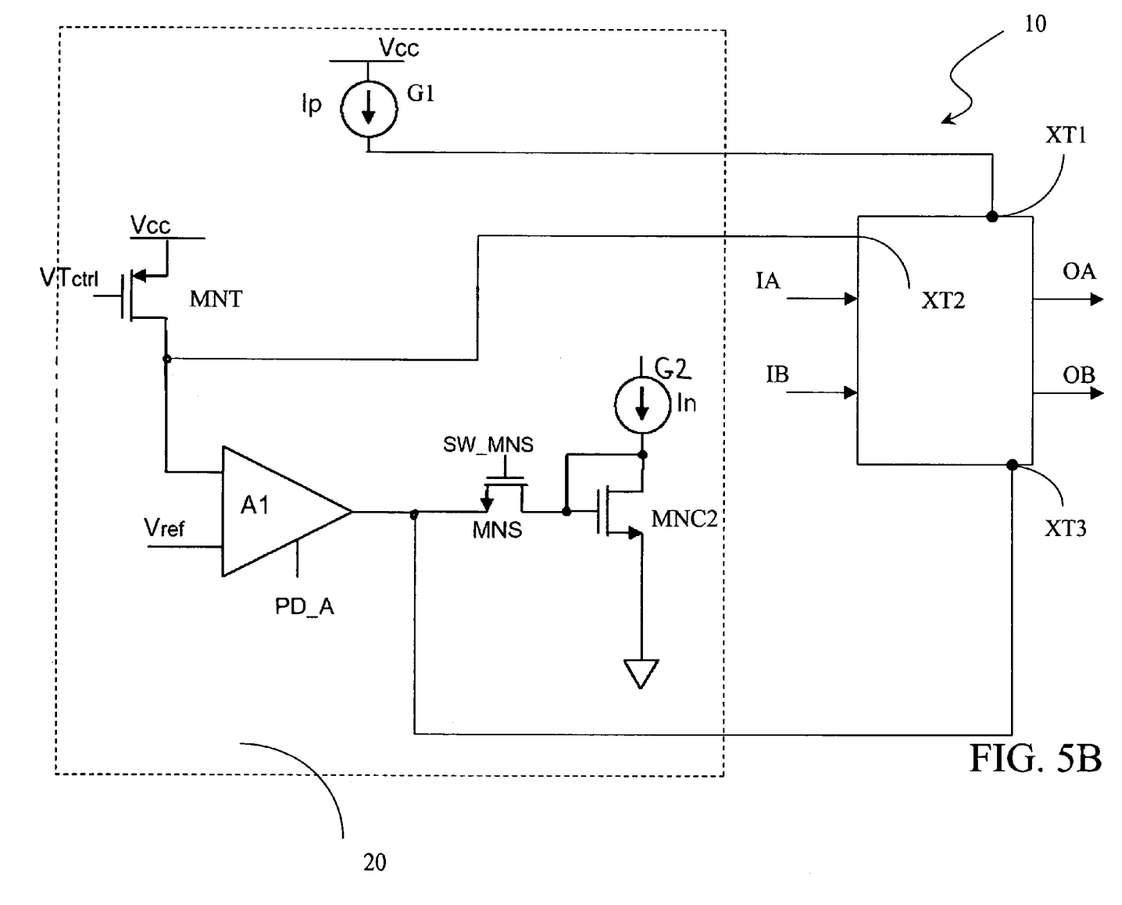
Figure 5C:
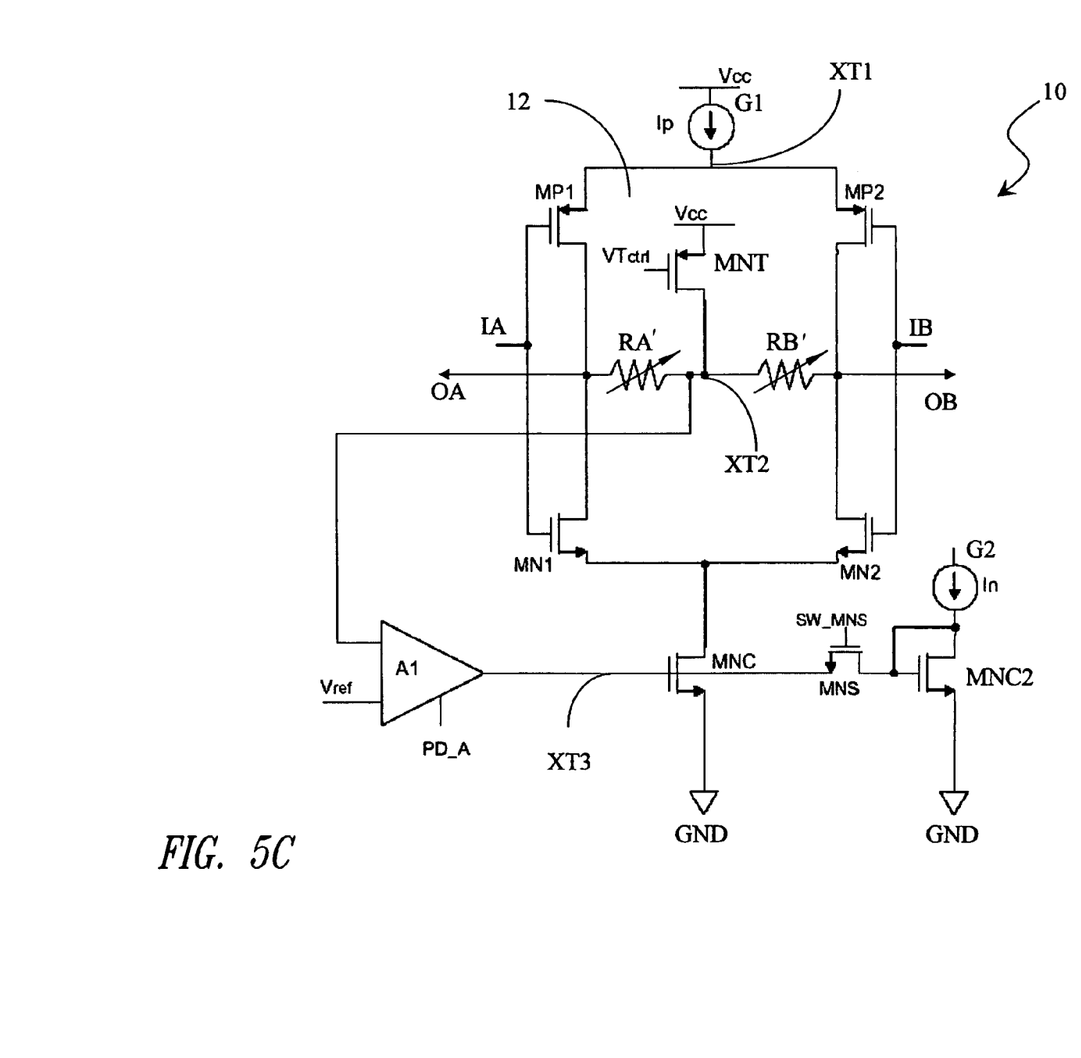
FIG. 5C schematically show a multi-standard transmitter made according to the present invention.

Basically, the first MNT and the second enabling transistor MNS together with the differential amplifier A1 and the generators G1 and G2 make a selective enabling circuit 20 of a common mode voltage level and of a differential mode voltage level of the multi-standard transmitter 10, as schematically shown in FIG. 5B.

In particular, the selective enabling circuit 20 is connected to the first XT1, second XT2 and third inner circuit nodes XT3 and comprises:
- the first generator G1 of the first regulation current Ip, inserted between the supply voltage reference Vcc and the first inner circuit node XT1;
- the first enabling transistor MNT, inserted between the supply voltage reference Vcc and the second inner circuit node XT2 and receiving the first enabling signal VTctrl on its own control terminal;
- the differential amplifier A1, having a first input terminal connected to the second inner circuit node XT2, a second input terminal receiving the reference voltage Vref, a control terminal receiving the second enabling signal PD_A and the output terminal connected to the third inner circuit node XT3;
- the second enabling transistor MNS, having the first conducting terminal connected to the third inner circuit node XT3, the second conducting terminal connected to the control terminal of the diode-connected transistor MNC2 and the control terminal receiving the third enabling signal SW_MNS;
- the diode-connected transistor MNC2, inserted between the second generator G2 and the ground GND and having the control terminal connected to the conducting terminal of the second enabling transistor MNS; and
- the second generator G2 of the second regulation current In, connected to the diode-connected transistor MNC2.

Basically, the selective enabling circuit 20 provides said inner circuit nodes, XT1, XT2 and XT3, suitable regulation signals apt for modifying the operating mode of the multi-standard transmitter itself.

In particular, the multi-standard transmitter 10 assumes, through suitable setting of the regulation currents Ip and In and of the enabling signals VTctrl, PD_A and SW_MNS, different operating modes, having common mode voltage levels compatible with known LVDS, CML/CPRI and LVPECL interfaces (with AC coupling and DC coupling) according to the following table.

TABLE 1

| | Operating Mode | | | |
|---|---|---|---|---|
| | 1st mode LVDS | 2nd mode CML/CPRI | 3rd mode LVPECL (DC) | 4th mode LVPECL (AC) |
| Ip | Ip1 = 8 mA | Ip2 = 0 | Ip3 = 30.7 mA | Ip3 = 30.7 mA |
| In | In1 = 0 | In2 = 16 mA; In3 = 32 mA | In1 = 0 | In1 = 0 |
| Vref | Vref1 = 1.2 V | — | Vref2 = 0 (MNCoff) | Vref3 = Vcc − 1.3 V |
| VTctrl | VTctrl1 = Vcc | VTctrl2 = GND | VTctrl1 = Vcc | VTctrl1 = Vcc |
| PD_A | PD_A1 = Low | PD_A2 = High | PD_A2 = High | PD_A1 = Low |
| SW_MNS | SW_MNS1 = Low | SW_MNS2 = High | SW_MNS1 = Low | SW_MNS1 = Low |

Based upon this table it is possible to see how the regulation currents, Ip and In, the reference voltage Vref and the regulation signals, VTctrl, PD_A and SW_MNS, allow the operating mode of the multi-standard transmitter 20 according to the invention to be modified.

First Operating Mode (LVDS Mode)

In this case the first regulation current Ip is set at a first value Ip1 equal to 8 mA, capable of ensuring that the differential stage 12 behaves like for a LVDS transmitter.

The differential amplifier A1 is active, since the second enabling signal PD_A is set at a first value PD_A1, in particular a low logic value, and the reference voltage Vref is made equal to Vref1=1.2V, just as the transistor MNC having the function of a current generator is also active, receiving an output signal from the differential amplifier A1 on its command terminal, such that the current delivered by the transistor MNC having the function of a current generator, together with the common mode reaction ensured by the gain of the amplifier A1 also ensures a correct common mode voltage level, and nominally equal to Vref1=1.2V.

It is not necessary to apply a second regulation current In, thus set at a first value In1=0, nor to use the first enabling transistor MNT, the command terminal of which is biased by the first enabling signal VTctrl with a first value VTctrl1 equal to the supply voltage reference Vcc. The second enabling transistor MNS is also disabled setting a first value SW_MNS1 equal to a low logic value for the third enabling signal SW_MNS.

Second Operating Mode (CML/CPRI Mode)

In this case, the second regulation current In is set at a second value In2 equal to 16 mA (for CML mode) or at a third value In3 equal to 32 mA (for CPRI mode).

Moreover, the differential amplifier A1 is switched off by the second enabling signal PD_A that assumes a second value PD_A2 equal to a high logic value. Moreover, it is not necessary to apply a first regulation current Ip, thus set at a second value Ip2=0.

The first enabling signal VTctrl is set at a second value VTctrl2 equal to the ground GND, so as to ensure, through the first enabling transistor MNT, that the end resistors RA and RB are connected to the supply voltage reference Vcc.

In this case the reference voltage Vref can assume any value.

Third Operating Mode (LVPECL Mode with DC Coupling)

In this case, the first regulation current Ip is set at a third value Ip3 equal to 30.7 mA, so that only the transistors MP1 and MP2 of the differential structure 12 are in operative conditions.

The second regulation current In is not applied, setting it at the first value In1=0 and also the reference voltage Vref is set at a second value Vref2 equal to 0, so as to switch off the transistor MNC having the function of a current generator.

The first enabling signal VTctrl is set at the first value VTctrl1 equal to the supply voltage reference Vcc and the second enabling signal PD_A is left at the second high value PD_A2, whereas the third enabling signal SW_MNS is taken back to the first low value SW_MNS1.

Fourth Operating Mode (LVPECL Mode with AC Coupling)

In this case, like for the previous mode, the first regulation current Ip is set at the third value Ip3 equal to 30.7 mA, the second current In is set at the first value In1=0 and the first enabling signal VTctrl is set at the first value VTctrl1 equal to the supply voltage reference Vcc. With respect to the DC coupling condition, however, the differential amplifier A1 is active, thanks to the second low value PD_A2 set for the second enabling signal PD_A and to a third value Vref3 equal to Vcc−1.3V set for the reference voltage Vref.

In this way, the transistor MNC having the function of a current generator is also active and ensures the correct common mode voltage value.

From what is indicated above it can easily be seen how:

the second enabling transistor MNS is used in LVDS and LVPECL modes (DC and AC coupling) to insulate the transistor MNC having the function of a current generator from the rest of the circuitry of the multi-standard transmitter 10, circuitry operating with the second regulation current In. Such a second enabling transistor MNS is only switched on in the CML(CPRI) mode;

the second enabling signal PD_A of the differential amplifier A1 is substantially an off signal for such an amplifier. In the case in which the differential amplifier A1 is made with an OTA amplifier, or in any case an amplifier that can be taken into a high impedance output state, the second enabling signal PD_A when high forces the amplifier into the high state Z.

Advantageously, the multi-standard transmitter 10 thus allows a plurality of operating modes to be obtained, the characteristic values of which are displayed in the following table:

TABLE 2

| | Operating modes | | |
|---|---|---|---|
| | LVDS | CML(CPRI) | LVPECL |
| Common mode voltage Vcm | 1.2 V | Vcc − 0.2 V (Vcc − 0.4 V) (DC coupling) | Vcc − 1.3 V |
| Differential voltage value | 400 mV | 400 mV (800 mV) | 800 mV |

Figure 6:
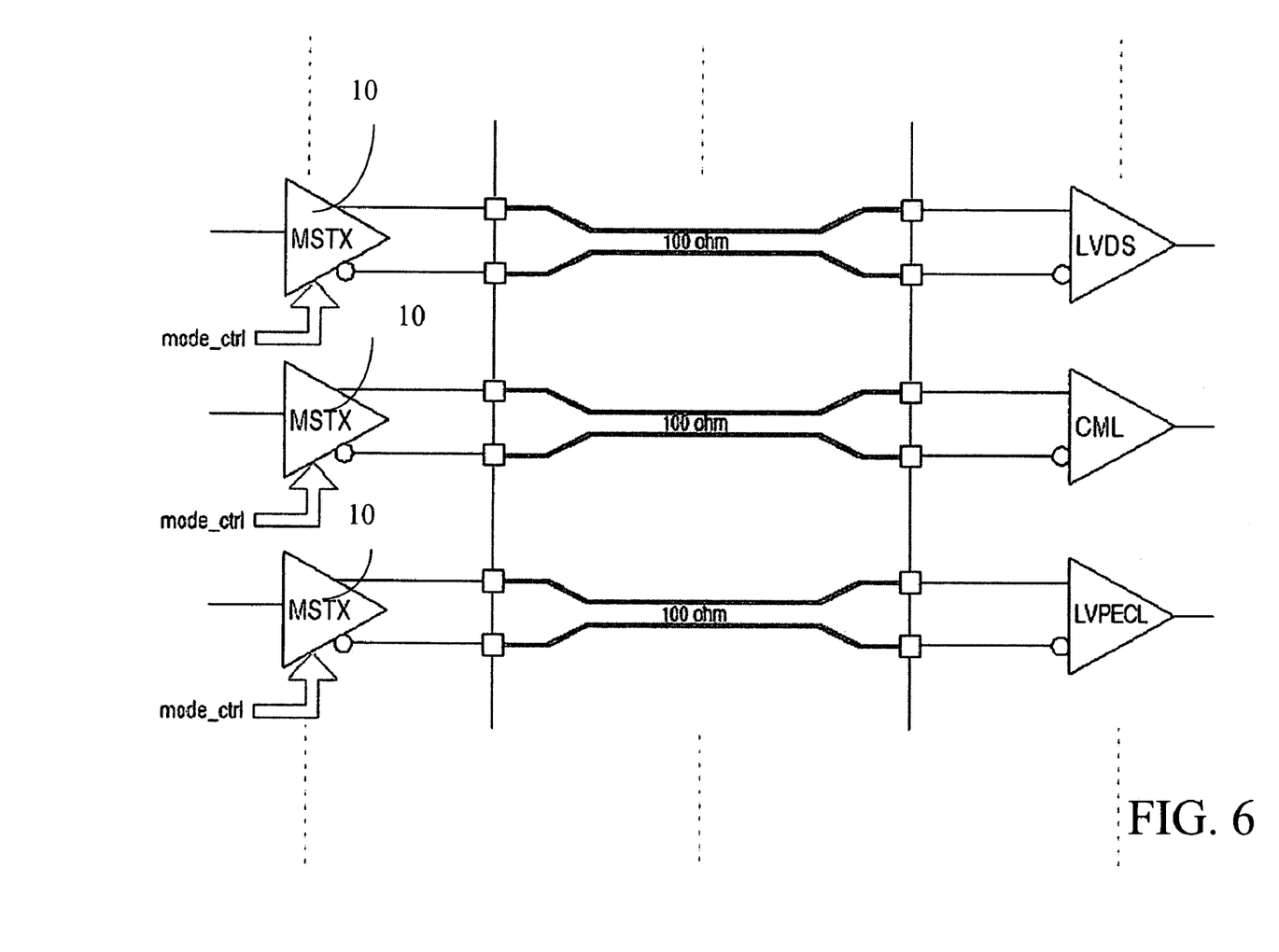
FIG. 6 schematically shows a telecommunication system comprising at least one multi-standard transmitter made according to the present invention.

The multi-standard transmitter 10 can be used in a telecommunication system as shown for example in FIG. 6, where it can clearly be seen how, thanks to a control word mode_ctrl of the operating mode of the multi-standard transmitter 10, the system is able to manage the communication with LVDS, CML or LVPECL receivers without requiring additional components.

Basically, the control word mode_ctrl is the set of the setting values shown in Table 1.

A communications system comprises at least one receiver and a transmitter interconnected by a communication bus. Advantageously, the transmitter is a multi-standard transmitter 10.

In particular, in the communications system of FIG. 6 a plurality of multi-standard transmitters 10 are included connected to a plurality of receivers of a different type. By suitably configuring the multi-standard transmitters 10 it is possible, to correctly communicate with all of the types of receivers shown in an independent manner.

In conclusion, the multi-standard transmitter 10 allows different operating modes of the transmitter itself to be set in a simple manner, thanks to the selective enabling circuit, making the multi-standard transmitter completely configurable, overcoming the limitations of known transmitters.

In other words, the multi-standard transmitter 10 simultaneously ensures total freedom and absolute simplicity of design of a telecommunication system, in this way reducing its costs design time.

Moreover, advantageously, the multi-standard transmitter comprises resistive end elements RA and RB always adapted to a standard 50 Ω, even in the case of integrated manufacture of the resistors themselves.

In the case of integrated resistors, it is also possible to use circuit solutions that are known in literature, which allow resistances to be made that are closely reconciled with the same impedance characteristic of the transmissive channel. The multi-standard transmitter does not in any way jeopardize the advantageous use of these circuit solutions.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A multi-standard transmitter, comprising:
a differential stage configured to be connected to a first voltage reference and to a second voltage reference, the differential stage including:
   a first input terminal and a second input terminal;
   a first output terminal and a second output terminal;
   a current generator transistor;
   a first transistor and a second transistor connected between a first inner circuit node and said current generator transistor and having respective control terminals connected together and to said first input terminal, said first and second transistors being interconnected at said first output terminal;
   a third transistor and a fourth transistor connected between said first inner circuit node and said current generator transistor and having respective control terminals connected together and to said second input terminal, said third and fourth transistors being interconnected at said second output terminal; and
   a first resistive end element and a second resistive end element connected between said first and second output terminals and interconnected at a second inner circuit node; and
a selective enabling circuit connected to said first and second inner circuit nodes, as well as to a third inner circuit node corresponding to a control terminal of said current generator transistor, said selective enabling circuit being configured to supply said inner circuit nodes with regulation signals to modify an operating mode of said multi-standard transmitter, wherein said selective enabling circuit comprises:
   a first enabling transistor configured to be connected between said first voltage reference and said second inner circuit node and having a control terminal configured to receive a first enabling signal;
   a differential amplifier, having a first input terminal connected to said second inner circuit node, a second input terminal being configured to receive a reference voltage, a control terminal configured to receive a second enabling signal and an output terminal connected to said third inner circuit node; and
   a second enabling transistor, having a first conducting terminal connected to said third inner circuit node and a control terminal configured to receive a third enabling signal.

2. A multi-standard transmitter according to claim 1, wherein said selective enabling circuit also comprises:
a first generator configured to generate a first regulation current connected between said first voltage reference and said first inner circuit node.

3. A multi-standard transmitter according to claim 2, wherein said first generator is configured to generate said first regulation current having at least a first, a second and a third value, said second value being zero.

4. A multi-standard transmitter according to claim 2, wherein said selective enabling circuit further comprises:
a second generator configured to generate a second regulation current, connected to a diode-connected transistor, said diode-connected transistor being configured to be connected to said second voltage reference and having a control terminal connected to a second conducting terminal of said second enabling transistor.

5. A multi-standard transmitter according to claim 4, wherein said second generator is configured to generate said second regulation current having at least a first, a second and a third value, said first value being zero.

6. A multi-standard transmitter according to claim 1, wherein said first, second and third enabling signals are logic signals that each can take on two values.

7. A multi-standard transmitter according to claim 6, wherein said first enabling signal is a voltage signal that can take on a first value corresponding to said first voltage reference and a second value corresponding to said second voltage reference.

8. A multi-standard transmitter according to claim 6, wherein said second enabling signal is a voltage signal having at least one first value corresponding to a low logic value and a second value corresponding to a high logic value.

9. A multi-standard transmitter according to claim 8, wherein said reference voltage has at least one first, a second and a third value, said second value being zero.

10. A multi-standard transmitter according to claim 6, wherein said third enabling signal is a voltage signal having at least one first value corresponding to a low logic value and a second value corresponding to a high logic value.

11. A multi-standard transmitter according to claim 1, wherein said differential amplifier is an amplifier that can be taken into a high impedance output state.

12. A multi-standard transmitter according to claim 1, wherein said differential amplifier is an OTA amplifier.

13. A multi-standard transmitter according to claim 4 wherein said selective enabling circuit is configured to set operating modes of said multi-standard transmitter by setting values of said enabling signals of said regulation currents, and of said reference voltage according to the following:
   in a first mode, the first regulation current equals a value Ip1, the second regulation current equals a value Ip1, the reference voltage equals a value Vref1, the first enabling signal equals a value VTctrl1, the second enabling signal equals a value PD Al1, and the third enabling equals a value SW MNS1;
   in a second mode, the first regulation current equals a value 1p2, the second regulation current equals the value IN2/In3, the first enabling signal equals the value VTctrl2, the second enabling signal equals the value PD A2, and the third enabling equals the value SW MNS2;
   in a third mode, the first regulation current equals a value 1p3, the second regulation current equals a value In1, the reference voltage equals a value Vref2, the first enabling signal equals the value VTctrl1, the second enabling signal equals the value PD A2, and the third enabling equals the value SW MNS1: and
   in a fourth mode, the first regulation current equals the value Ip3, the second regulation current equals the value In1, the reference voltage equals a value Vref3, the first enabling signal equals the value VTctrl1, the second enabling signal equals the value PD A1, and the third enabling equals the value SW MNS1.

14. A multi-standard transmitter according to claim 13, wherein said first operating mode corresponds to operation of a LVDS transmitter and said values set for said enabling signals, for said regulation currents and for said reference voltage are equal to:
   Ip1=8 mA
   In1=0
   Vref1=1.2V
   VTctrl=Vcc
   PD_A1=Low
   SW_MNS1=Low.

15. A multi-standard transmitter according to claim 13, wherein said second operating mode corresponds to operation of a CML transmitter and said values set for said enabling signals, for said regulation currents and for said reference voltage are equal to:
   Ip2=0
   In2=16 mA
   VTctrl=GND
   PD_A2=High
   SW_MINS2=High.

16. A multi-standard transmitter according to claim 13, wherein said second operating mode corresponds to operation of a CPRI transmitter and said values set for said enabling signals, for said regulation currents and for said reference voltage are equal to:
   Ip2=0
   In3=32 mA
   VTctrl=GND
   PD_A2=High
   SW_MNS2=High.

17. A multi-standard transmitter according to claim 13, wherein said third operating mode corresponds to operation of a LVPECL transmitter with DC coupling and said values set for said enabling signals, for said regulation currents and for said reference voltage are equal to:
   Ip3=30.7 mA
   In1=0
   Vref2=0
   VTctrl=Vcc
   PD_A1=High
   SW_MNS1=Low.

18. A multi-standard transmitter according to claim 13, wherein said fourth operating mode corresponds to operation of a LVPECL transmitter with AC coupling and said values set for said enabling signals, for said regulation currents and for said reference voltage are equal to:
   1p3=30.7 mA
   In1=0
   Vref3=Vcc−1.3V
   VTctrl=Vcc
   PD_A1=Low SW_MNS1=Low.

19. A multi-standard transmitter according to claim 1 wherein said first and second resistive end elements are equal to 50 Ω.

20. A multi-standard transmitter according to claim 1 wherein said first and second resistive end elements are trimmable resistors.

21. A multi-standard transmitter according to claim 20, wherein said first and second resistive end elements are integrated on silicon.

22. A communication system, comprising:
   a receiver;
   a communication bus; and
   a transmitter connected to the receiver by the communication bus, said transmitter being a multi-standard transmitter that includes:
   a differential stage configured to be connected to a first voltage reference and to a second voltage reference, the differential stage including:
      a first input terminal and a second input terminal
      a first output terminal and a second output terminal
      a current generator transistor;
      a first transistor and a second transistor connected between a first inner circuit node and said current generator transistor and having respective control terminals connected together and to said first input terminal, said first and second transistors being interconnected at said first output terminal;
      a third transistor and a fourth transistor connected between said first inner circuit node and said current generator transistor and having respective control terminals connected together and to said second input terminal, said third and fourth transistors being interconnected at said second Output terminal; and
      a first resistive end element and a second resistive end element connected between said first and second output terminals and interconnected at a second inner circuit node; and
   a selective enabling circuit connected to said first and second inner circuit nodes, as well as to a third inner circuit node corresponding to a control terminal of said current generator transistor, said selective enabling circuit being configured to supply said inner circuit nodes with regulation signals to modify an operating mode of said multi-standard transmitter, wherein said selective enabling circuit comprises:
   a first enabling transistor connected between said first voltage reference and said second inner circuit node and having a control terminal configured to receive a first enabling signal;

a differential amplifier, having a first input terminal connected to said second inner circuit node, a second input terminal receiving a reference voltage, a control terminal configured to receive a second enabling signal and an output terminal connected to said third inner circuit node; and a second enabling transistor, having a first conducting terminal connected to said third inner circuit node and a control terminal configured to receive a third enabling signal.

23. A communication system according to claim 22, wherein said selective enabling circuit also comprises:

a first generator configured to generate a first regulation current connected between said first voltage reference and said first inner circuit node.

24. A communication system according to claim 23, wherein said selective enabling circuit further comprises:

a second generator configured to generate a second regulation current, connected to a diode-connected transistor, said diode-connected transistor being connected to said second voltage reference and having a control terminal connected to a second conducting terminal of said second enabling transistor.

25. A circuit configured to be connected to a first voltage reference and to a second voltage reference, the circuit comprising:

a differential stage that includes:

a first input terminal and a second input terminal;

a first output terminal and a second output terminal;

a current generator transistor;

a first transistor and a second transistor connected between a first inner circuit node and the current generator transistor and having respective control terminals connected together and to the first input terminal, the first and second transistors being interconnected at the first output terminal;

a third transistor and a fourth transistor connected between the first inner circuit node and the current generator transistor and having respective control terminals connected together and to the second input terminal, the third and fourth transistors being interconnected at the second output terminal; and a first resistive end element and a second resistive end element connected between the first and second output terminals and interconnected at a second inner circuit node; and a selective enabling circuit having an input connected to the second inner circuit node and an output connected to a control terminal of the current generator transistor, wherein the selective enabling circuit comprises:

a first enabling transistor configured to be connected between the first voltage reference and the second inner circuit node and having a control terminal configured to receive a first enabling signal;

a differential amplifier having a first input terminal connected to the second inner circuit node, a second input terminal configured to receive a reference voltage, a control terminal configured to receive a second enabling signal and an output terminal connected to the third inner circuit node; and a second enabling transistor having a first conducting terminal connected to the third inner circuit node arid a control terminal configured to receive a third enabling signal.

26. The differential stage of claim 25, wherein the selective enabling circuit also comprises:

a first generator configured to generate a first regulation current connected between the first voltage reference and the first inner circuit node.

27. The differential stage of claim 26, wherein the selective enabling circuit further comprises:

a second generator configured to generate a second regulation current, connected to a diode-connected transistor, the diode-connected transistor being configured to be connected to the second voltage reference and having a control terminal connected to a second conducting terminal of the second enabling transistor.

* * * * *